US011837670B2

(12) United States Patent
Sulfridge et al.

(10) Patent No.: US 11,837,670 B2
(45) Date of Patent: Dec. 5, 2023

(54) SEMICONDUCTOR DEVICES WITH SINGLE-PHOTON AVALANCHE DIODES, LIGHT SCATTERING STRUCTURES, AND MULTIPLE DEEP TRENCH ISOLATION STRUCTURES

(71) Applicant: SEMICONDUCTOR COMPONENTS INDUSTRIES, LLC, Phoenix, AZ (US)

(72) Inventors: Marc Allen Sulfridge, Boise, ID (US); Anne Deignan, County Limerick (IE); Nader Jedidi, Cork (IE); Michael Gerard Keyes, Dromcollogher (IE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 322 days.

(21) Appl. No.: 16/949,228

(22) Filed: Oct. 21, 2020

(65) Prior Publication Data
US 2021/0175265 A1 Jun. 10, 2021

Related U.S. Application Data

(60) Provisional application No. 62/981,902, filed on Feb. 26, 2020, provisional application No. 62/943,475, filed on Dec. 4, 2019.

(51) Int. Cl.
*H01L 31/02* (2006.01)
*H04N 25/63* (2023.01)
(Continued)

(52) U.S. Cl.
CPC .......... *H01L 31/02027* (2013.01); *G02B 3/06* (2013.01); *H01L 27/1463* (2013.01);
(Continued)

(58) Field of Classification Search
CPC ......... H01L 27/14603; H01L 27/14638; H01L 27/14683; H01L 27/14605;
(Continued)

(56) References Cited

U.S. PATENT DOCUMENTS 7,054,534 B1 5/2006 Gunn, III et al.
7,800,192 B2 * 9/2010 Venezia ............ H01L 27/14632
257/292

(Continued)

OTHER PUBLICATIONS

Yokogawa et al.: "IR sensitivity enhancement of CMOS Image Sensor with diffractive light trapping pixels." Scientific Reports 7, 3832 (2017).

(Continued)

*Primary Examiner* — Que Tan Le
*Assistant Examiner* — Mai Thi Ngoc Tran
(74) *Attorney, Agent, or Firm* — Treyz Law Group, P.C.; Joseph F. Guihan

(57) ABSTRACT

An imaging device may include single-photon avalanche diodes (SPADs). To improve the sensitivity and signal-to-noise ratio of the SPADs, light scattering structures may be formed in the semiconductor substrate to increase the path length of incident light through the semiconductor substrate. To mitigate crosstalk, multiple rings of isolation structures may be formed around the SPAD. An outer deep trench isolation structure may include a metal filler such as tungsten and may be configured to absorb light. The outer deep trench isolation structure therefore prevents crosstalk between adjacent SPADs. Additionally, one or more inner deep trench isolation structures may be included. The inner deep trench isolation structures may include a low-index filler to reflect light and keep incident light in the active area of the SPAD.

20 Claims, 10 Drawing Sheets

(51) Int. Cl.
*H01L 27/146* (2006.01)
*H01L 31/055* (2014.01)
*H01L 31/107* (2006.01)
*H01L 31/0232* (2014.01)
*G02B 3/06* (2006.01)

(52) U.S. Cl.
CPC .. *H01L 27/14605* (2013.01); *H01L 27/14621* (2013.01); *H01L 27/14627* (2013.01); *H01L 27/14629* (2013.01); *H01L 27/14643* (2013.01); *H01L 27/14649* (2013.01); *H01L 31/02327* (2013.01); *H01L 31/055* (2013.01); *H01L 31/107* (2013.01); *H01L 27/1464* (2013.01); *H04N 25/63* (2023.01)

(58) Field of Classification Search
CPC ......... H01L 27/14629; H01L 27/14643; H01L 31/02027; H01L 31/107; H01L 31/02327; H01L 31/055; H01L 27/14621; H01L 27/14627; H01L 27/1463; H01L 27/14649; H01L 27/1464; H01L 31/02363; H01L 29/7818; H01L 21/763; H01L 29/66681; H01L 29/0649; H01L 29/16; H01L 29/0878; H01L 29/1087; H01L 29/7823; H01L 29/861; G02B 3/06; H04N 25/63; Y02E 10/52
USPC ...................................... 250/208.1
See application file for complete search history.

(56) References Cited

U.S. PATENT DOCUMENTS

| | | | |
|---|---|---|---|
| 8,889,455 B2 | 11/2014 | Duane et al. | |
| 9,373,732 B2 | 6/2016 | Velichko | |
| 10,304,987 B2 | 5/2019 | Droz et al. | |
| 11,032,496 B2 * | 6/2021 | Webster | G01S 17/894 |
| 11,289,524 B2 | 3/2022 | Sulfridge et al. | |
| 2007/0075423 A1 | 4/2007 | Ke et al. | |
| 2008/0303932 A1 | 12/2008 | Wang et al. | |
| 2013/0015331 A1 | 1/2013 | Birk et al. | |
| 2013/0082286 A1 | 4/2013 | Finkelstein et al. | |
| 2013/0193546 A1 | 8/2013 | Webster et al. | |
| 2014/0015085 A1 | 1/2014 | Ikeda et al. | |
| 2014/0049783 A1 | 2/2014 | Royo Royo et al. | |
| 2014/0077323 A1 | 3/2014 | Velichko et al. | |
| 2015/0340391 A1 | 11/2015 | Webster | |
| 2017/0339355 A1 | 11/2017 | Lenchenkov et al. | |
| 2017/0366769 A1 | 12/2017 | Mlinar et al. | |
| 2018/0026147 A1 * | 1/2018 | Zhang | H01L 27/1463 257/292 |
| 2018/0182806 A1 | 6/2018 | Jin et al. | |
| 2018/0211990 A1 | 7/2018 | Yorikado et al. | |
| 2018/0308881 A1 | 10/2018 | Hynecek | |
| 2019/0097075 A1 | 3/2019 | Rae | |
| 2019/0131339 A1 | 5/2019 | Chiang et al. | |
| 2019/0131478 A1 | 5/2019 | Wang et al. | |
| 2019/0165026 A1 * | 5/2019 | Kuo | H01L 27/1463 |
| 2019/0326482 A1 | 10/2019 | Brick et al. | |
| 2020/0020730 A1 | 1/2020 | Mlinar et al. | |
| 2020/0058808 A1 * | 2/2020 | Morimoto | H01L 31/18 |
| 2020/0284883 A1 * | 9/2020 | Ferreira | G01S 17/10 |
| 2021/0082978 A1 | 3/2021 | Hsieh | |
| 2021/0408090 A1 | 12/2021 | Kohyama | |
| 2022/0199668 A1 | 6/2022 | Dotani et al. | |

OTHER PUBLICATIONS

Park et al.: "Pixel Technology for Improving IR Quantum Efficiency of Backside-illuminated CMOS Image Sensor." International Image Sensor Society, 2019 Workshop. Jun. 23-27, 2019.

Green et al.: "Characterization of 23-Percent Efficient Silicon Solar Cells." IEEE Transactions on Electron Devices. vol. 37, No. 2. Feb. 1990.

* cited by examiner

SEMICONDUCTOR DEVICES WITH SINGLE-PHOTON AVALANCHE DIODES, LIGHT SCATTERING STRUCTURES, AND MULTIPLE DEEP TRENCH ISOLATION STRUCTURES

This application claims the benefit of provisional patent application No. 62/943,475, filed Dec. 4, 2019, and provisional patent application No. 62/981,902, filed Feb. 26, 2020, which are hereby incorporated by reference herein in their entireties.

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals.

Conventional image sensors may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. Single-photon avalanche diodes may be capable of single-photon detection.

It is within this context that the embodiments described herein arise.

DETAILED DESCRIPTION

Embodiments of the present invention relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves, and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices (such as the ones described in connection with FIGS. 1-4), on the other hand, the photon detection principle is different. The light sensing diode is biased above its breakdown point, and when an incident photon generates an electron or hole, this carrier initiates an avalanche breakdown with additional carriers being generated. The avalanche multiplication may produce a current signal that can be easily detected by readout circuitry associated with the SPAD. The avalanche process can be stopped (or quenched) by lowering the diode bias below its breakdown point. Each SPAD may therefore include a passive and/or active quenching circuit for halting the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
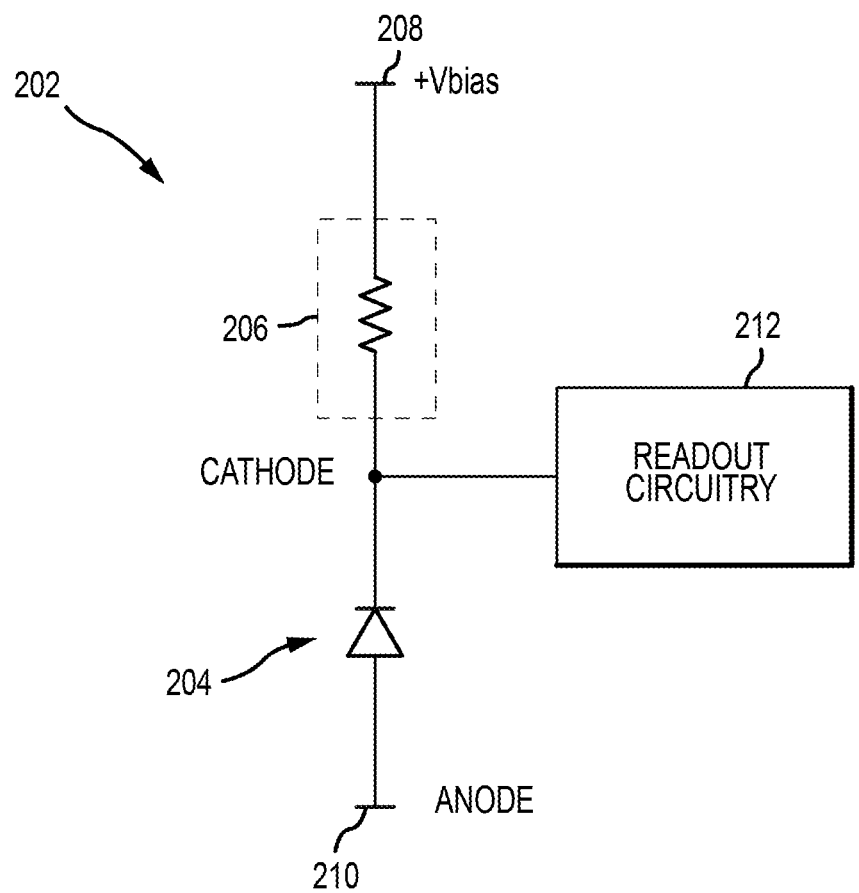
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 210 (e.g., a ground power supply voltage terminal) and a second supply voltage terminal 208 (e.g., a positive power supply voltage terminal). In particular, SPAD device 202 includes a SPAD 204 having an anode terminal connected to power supply voltage terminal 210 and a cathode terminal connected directly to quenching circuitry 206. SPAD device 202 that includes SPAD 204 connected in series with a quenching resistor 206 is sometimes referred to collectively as a photo-triggered unit or "microcell." During operation of SPAD device 202, supply voltage terminals 208 and 210 may be used to bias SPAD 204 to a voltage that is higher than the breakdown voltage (e.g., bias voltage Vbias is applied to terminal 208).

Breakdown voltage is the largest reverse voltage that can be applied to SPAD 204 without causing an exponential increase in the leakage current in the diode. When SPAD 204 is reverse biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor component is used to form quenching circuitry 206. This is an example of passive quenching circuitry.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing. In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to terminal 208 or any desired portion of the SPAD device. In some cases, quenching circuitry 206 may be considered integral with readout circuitry 212.

Because SPAD devices can detect a single incident photon, the SPAD devices are effective at imaging scenes with low light levels. Each SPAD may detect the number of photons that are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
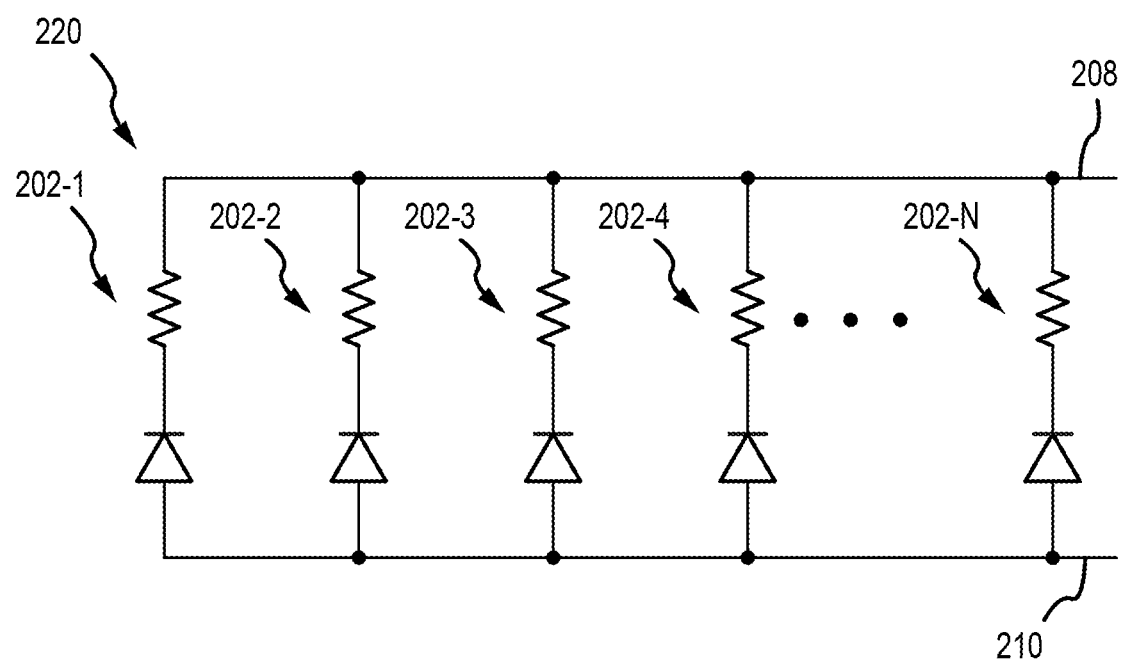
FIG. 2 is a diagram of an illustrative silicon photomultiplier in accordance with an embodiment.

Multiple SPAD devices may be grouped together to help increase dynamic range. FIG. 2 is a circuit diagram of an illustrative group 220 of SPAD devices 202. The group or array of SPAD devices may sometimes be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier 220.

Each SPAD device 202 may sometimes be referred to herein as a SPAD pixel 202. Although not shown explicitly in FIG. 2, readout circuitry for the silicon photomultiplier 220 may measure the combined output current from all of SPAD pixels in the silicon photomultiplier. Configured in this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of FIG. 2 in which the plurality of SPAD pixels 202 share a common output in silicon photomultiplier 220 is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
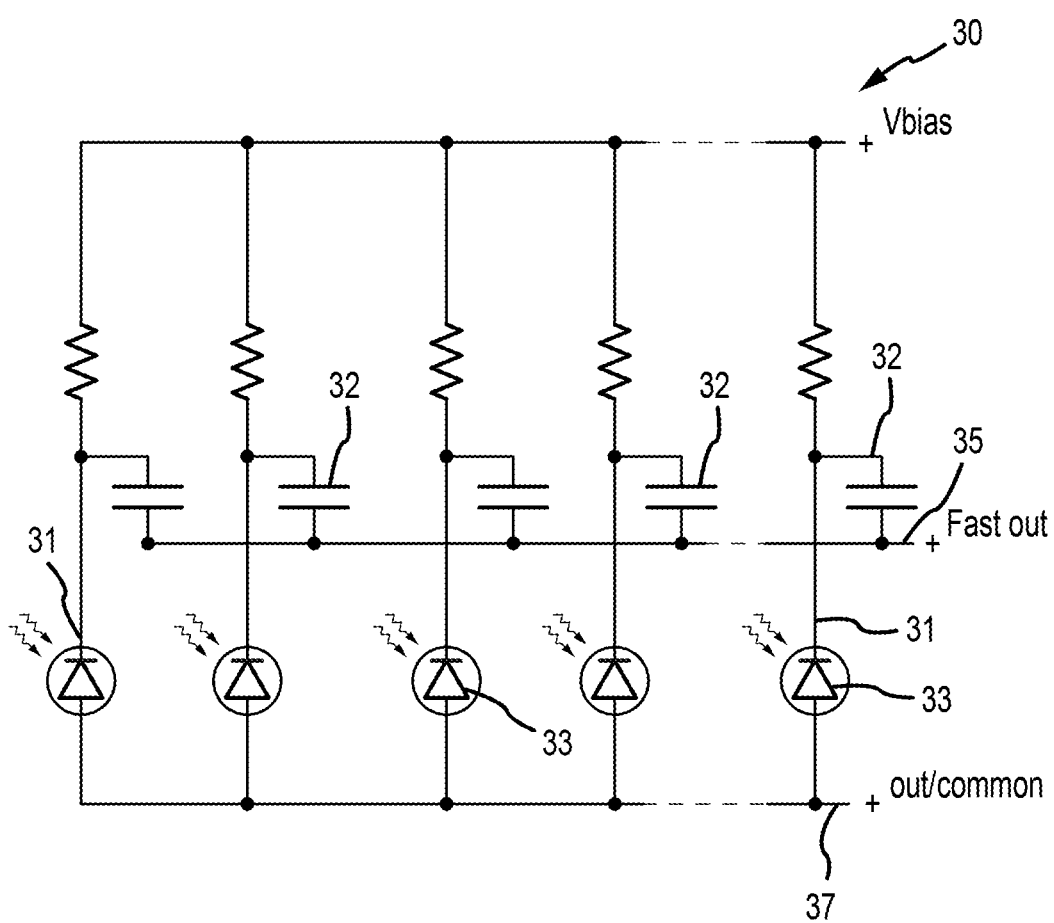
FIG. 3 is a schematic diagram of an illustrative silicon photomultiplier with a fast output terminal in accordance with an embodiment.

FIG. 3 illustrates a silicon photomultiplier 30. As shown in FIG. 3, SiPM 30 has a third terminal 35 which is capacitively coupled to each cathode terminal 31 in order to provide a fast readout of the avalanche signals from the SPADs 33. When then SPADs 33 emits a current pulse, part of the resulting change in voltage at the cathode 31 will be coupled via the mutual capacitance into the third ("fast") output terminal 35. Using the third terminal 35 for readout avoids the compromised transient performance resulting from the relatively large RC time constant associated with the biasing circuit that biases the top terminal of the quenching resistor.

Figure 4:
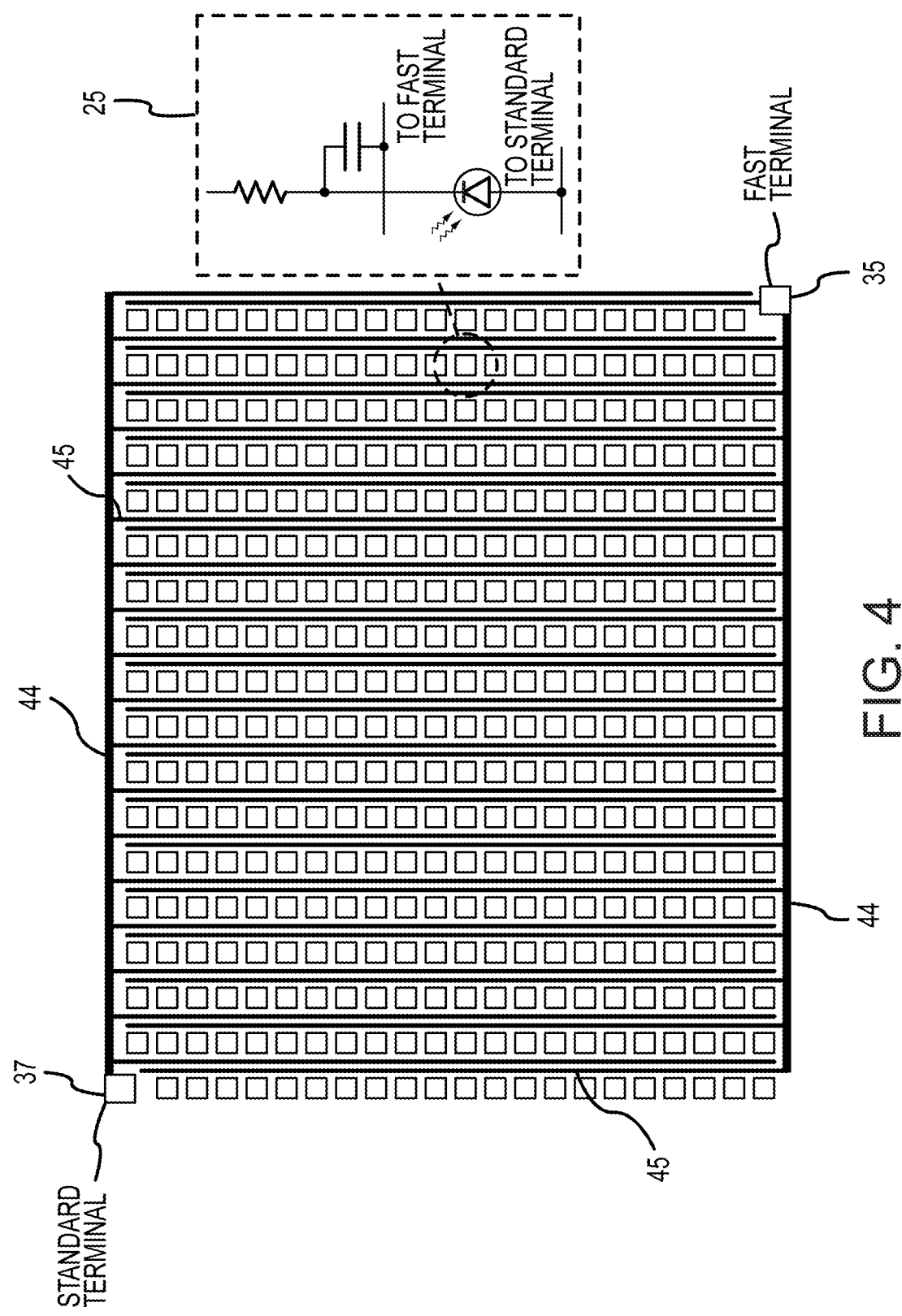
FIG. 4 is a diagram of an illustrative silicon photomultiplier comprising an array of microcells.

It will be appreciated by those skilled in the art that silicon photomultipliers include major bus lines 44 and minor bus lines 45 as illustrated in FIG. 4. The minor bus lines 45 may connect directly to each individual microcell 25. The minor bus lines 45 are then coupled to the major bus lines 44 which connect to the bond pads associated with terminals 37 and 35. Typically, the minor bus lines 45 extend vertically between the columns of microcells 25, whereas the major bus lines 44 extend horizontally adjacent the outer row of the microcells 25.

Figure 5:
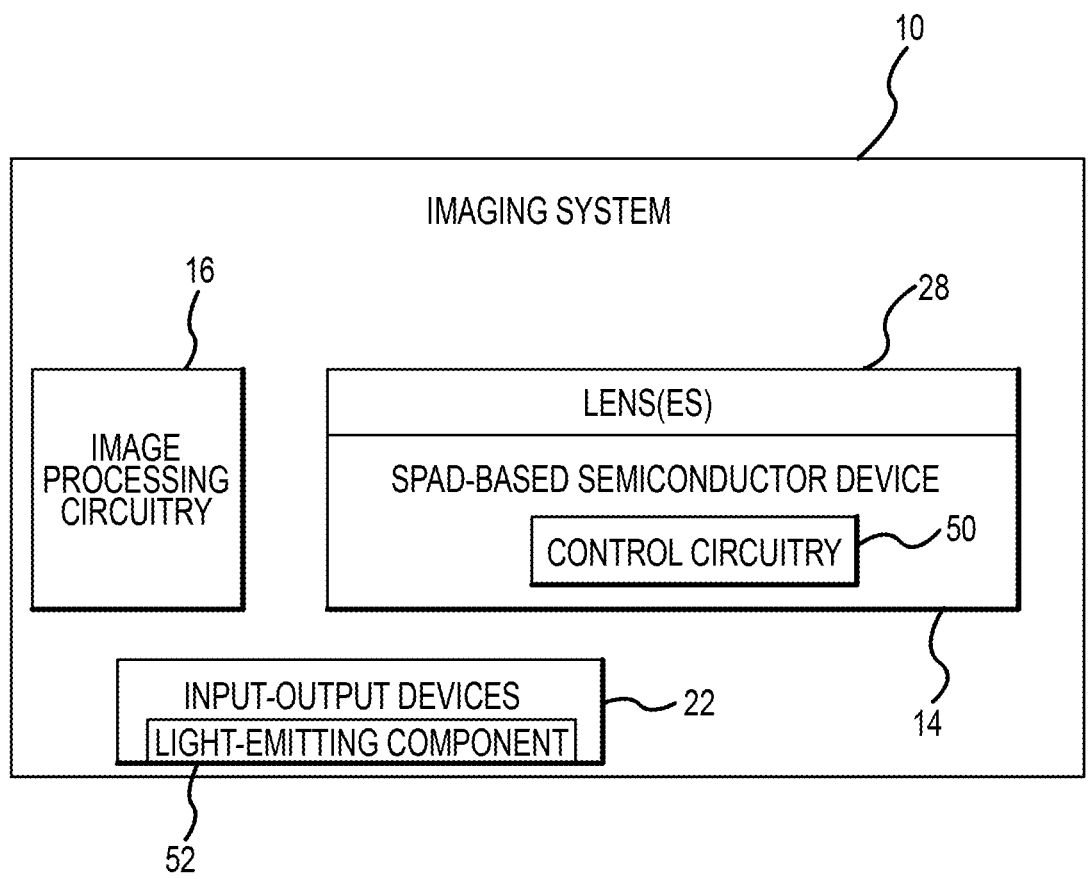
FIG. 5 is a schematic diagram of an illustrative imaging system that includes a SPAD-based semiconductor device in accordance with an embodiment.

An imaging system 10 with a SPAD-based semiconductor device is shown in FIG. 5. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system 10 may be used for LIDAR applications. Imaging system 10 may sometimes be referred to as a SPAD-based imaging system.

Imaging system 10 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more). In some SPAD-based semiconductor devices, each SPAD pixel may be covered by a respective color filter element and/or microlens.

SPAD-based semiconductor device 14 may include circuitry such as control circuitry 50. The control circuitry for the SPAD-based semiconductor device may be formed either on-chip (e.g., on the same semiconductor substrate as the SPAD devices) or off-chip (e.g., on a different semiconductor substrate as the SPAD devices). The control circuitry may control operation of the SPAD-based semiconductor device. For example, the control circuitry may operate active quenching circuitry within the SPAD-based semiconductor device, may control a bias voltage provided to bias voltage supply terminal 208 of each SPAD, may control/monitor the readout circuitry coupled to the SPAD devices, etc.

The SPAD-based semiconductor device 14 may optionally include additional circuitry such as logic gates, digital counters, time-to-digital converters, bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc. Any of the aforementioned circuits may be considered part of the control circuitry 50 of FIG. 5.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene. In some cases, some or all of control circuitry 50 may be formed integrally with image processing circuitry 16.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component 52 may be included in the imaging system to emit light (e.g., infrared light or light of any other desired type). Light-emitting component 52 may be a laser, light-emitting diode, or any other desired type of light-emitting component. Semiconductor device 14 may measure the reflection of the light off of an object to measure distance to the object in a LIDAR (light detection and ranging) scheme. Control circuitry 50 that is used to control operation of the SPAD-based semiconductor device may also optionally be used to control operation of light-emitting component 52. Image processing circuitry 16 may use known times (or a known pattern) of light pulses from the light-emitting component while processing data from the SPAD-based semiconductor device.

The likelihood of a photon being absorbed (e.g., the absorption percentage) increases with increasing semiconductor depth. To improve the sensitivity of a SPAD-based semiconductor device, it would therefore be desirable to increase the thickness of the semiconductor substrate. However, manufacturing considerations and other design factors may prevent or discourage semiconductor substrates from being thick enough for a target absorption percentage. To increase the absorption percentage without increasing semiconductor substrate thickness, light scattering structures may be included in the SPAD-based semiconductor device. The scattering structures may scatter incident light (e.g., using a low-index material that fills trenches in the semiconductor substrate), thereby increasing the path length of the light through the semiconductor substrate and increasing the probability of the incident light being absorbed by the semiconductor. Scattering the incident light (using refraction and/or diffraction) to increase the path length may be particularly helpful for incident light of higher wavelengths. Scattering incident light may improve absorption efficiency but may also make the SPAD-based semiconductor device susceptible to crosstalk. Multiple isolation structures may be included around each SPAD to prevent cross-talk between adjacent microcells. The SPAD-based semiconductor devices described herein may be used to sense near infrared light or light of any other desired type.

Figure 6:
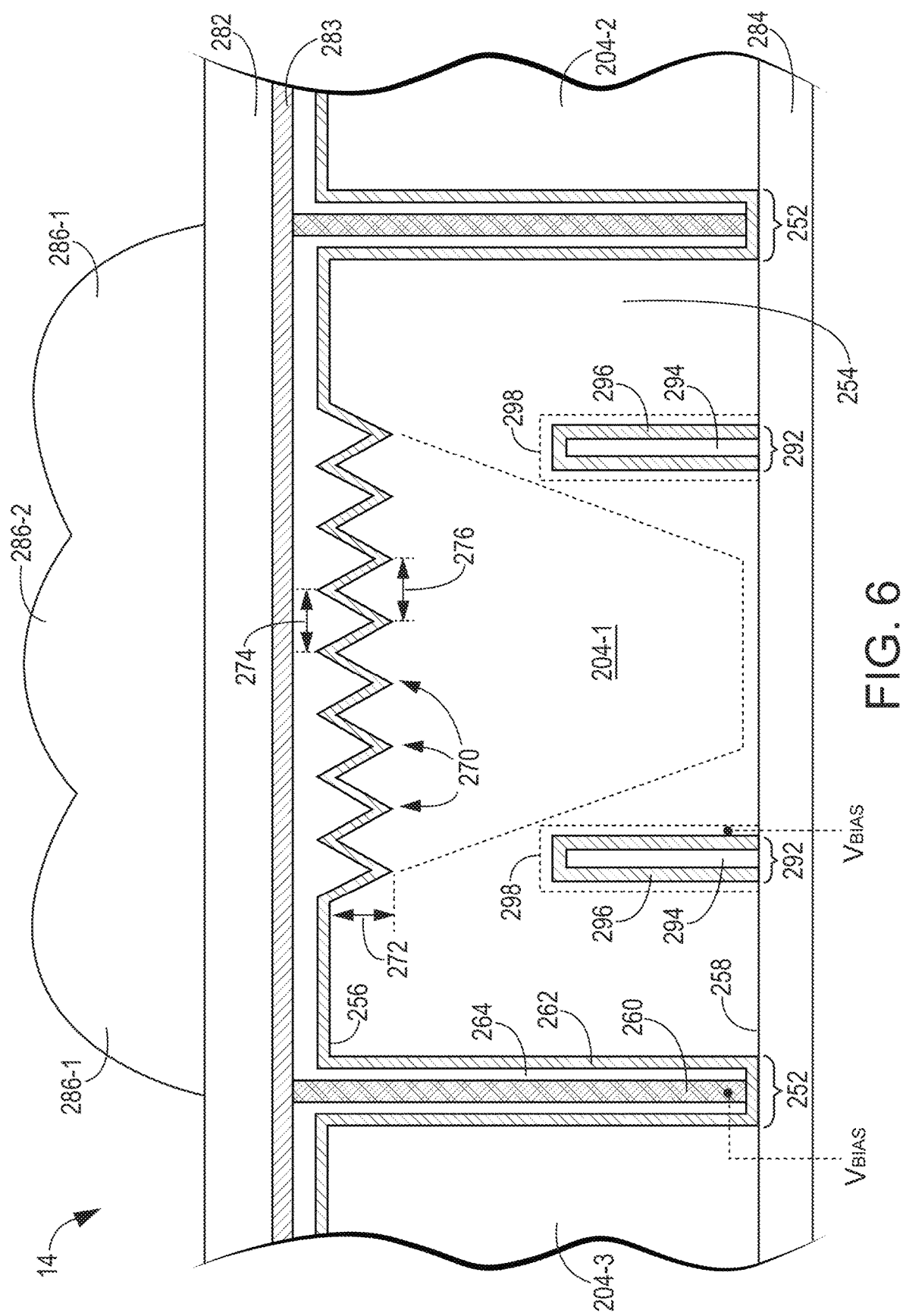
FIG. 6 is a cross-sectional side view of an illustrative SPAD-based semiconductor device having an outer isolation structure that absorbs light and an inner front side deep trench isolation (FDTI) structure that reflects light in accordance with an embodiment.

FIG. 6 is a cross-sectional side view of an illustrative SPAD-based semiconductor device having scattering structures and multiple isolation structures. SPAD-based semiconductor device 14 includes a SPAD 204-1 that is adjacent to respective SPADs (e.g., SPAD 204-2 and SPAD 204-3 in FIG. 6). Each SPAD may be considered part of a respective SPAD device, SPAD pixel, or microcell (e.g., microcell 202 in FIG. 1). The SPAD-based semiconductor device 14 in FIG. 6 is a backside illuminated (BSI) device (e.g., incident light passes through the back surface of the substrate). SPAD 204-1 may be isolated from the adjacent SPADs by isolation structures. The isolation structures may include one or more deep trench isolation (DTI) structures.

In some cases, a single ring of deep trench isolation structures may surround the SPAD in a given microcell. Alternatively, for improved performance, two or more rings of isolation structures may surround the SPAD. The isolation structures may include trenches with different fillers that serve different functions. Some of the isolation structures may include a metal filler such as tungsten that absorbs light. The light absorbing material may prevent photons (e.g., generated by the SPAD during an avalanche) from passing to a neighboring microcell and causing crosstalk. Alternatively, some of the isolation structures may include a low-index filler that causes total internal reflection. The low-index filler may reflect light, keeping the light within the active region of the SPAD to increase efficiency.

FIG. 6 shows a first isolation structure 252 that includes a light absorbing material. Trenches for structure 252 may be formed in a substrate 254 (e.g., a semiconductor substrate formed from a material such as silicon) that extends between the back surface 256 and the front surface 258. The trench for isolation structures 252 therefore extends completely through the semiconductor substrate 254. The trench may be etched from the backside of the substrate (e.g., from surface 256 towards surface 258). In this case, the isolation structures may be referred to as backside deep trench isolation (BDTI). Forming the trench as backside deep trench isolation may mitigate complexity and cost during manufacturing. However, the trench may alternatively be etched from the front side of the substrate (e.g., from surface 258 towards surface 256). In this case, the isolation structures may be referred to as front side deep trench isolation (FDTI).

The trench of isolation structures 252 may be filled with a metal filler 260 (e.g., tungsten or any other desired metal). The metal filler absorbs incident light and isolates SPAD 204-1 from adjacent SPADs.

A high dielectric constant coating 262 may be formed in the trench between the substrate 254 and metal filler 260. The high dielectric constant coating 262 (sometimes referred to as high k coating 262 or passivation layer 262) may mitigate dark current. As one example, the passivation coating may be an oxide coating (e.g., aluminum oxide, hafnium oxide, tantalum oxide, etc.). A buffer layer 264 may be formed between passivation coating 262 and metal filler 260. The buffer layer 264 may be formed from silicon dioxide or another desired material (e.g., a material compatible with both the passivation coating and the metal filler).

The isolation structures may form a ring around the microcell including SPAD 204-1. SPAD 204-1 may be laterally surrounded by isolation structures 252.

In addition to the isolation structures, scattering structures 270 may be formed in the substrate. Scattering structures 270 may be configured to scatter incident light (e.g., using a low-index material that fills trenches in substrate 254), thereby increasing the path length of the light through the semiconductor substrate and increasing the probability of the incident light being absorbed by the semiconductor. Scattering the incident light (using refraction and/or diffraction) to increase the path length may be particularly helpful for incident light of higher wavelengths (e.g., near infrared light).

The scattering structures may be formed using backside trenches (e.g., trenches that extend from surface 256 towards surface 258). The backside trenches may be filled by the same passivation coating 262 and buffer layer 264 as isolation structures 252. As shown, passivation coating 262 has portions in the trenches of isolation structures 252 and portions in the trenches of scattering structures 270. This enables the passivation layer in both isolation structures 252 and scattering structures 270 to be formed in the same deposition step during manufacturing if desired. The thickness of passivation coating 262 may be uniform in isolation structures 252 and scattering structures 270 or may be different in isolation structures 252 and scattering structures 270.

As shown in FIG. 6, buffer layer 264 has portions in the trenches of isolation structures 252 and portions in the trenches of scattering structures 270. This enables the buffer layer 264 in both isolation structures 252 and scattering structures 270 to be formed in the same deposition step during manufacturing if desired. The thickness of buffer layer 264 may be uniform in isolation structures 252 and scattering structures 270 or may be different in isolation structures 252 and scattering structures 270. As shown in FIG. 6, the buffer layer 264 may fill trenches for scattering structures 270 and extend above the plane of surface 256. The upper surface of buffer layer 264 may be coplanar with the upper surface of metal filler 260.

The material(s) that fill the trenches (e.g., buffer 264 and passivation layer 262) of light scattering structures 270 may have a lower refractive index than substrate 254 (e.g., a refractive index that is lower by more than 0.1, more than 0.2, more than 0.3, more than 0.5, more than 1.0, more than 1.5, more than 2.0, etc.). The low-index material in the trenches causes refractive scattering of incident light.

Scattering structures 270 scatter incident light, thereby increasing the path length of the light through the semiconductor substrate and increasing the probability of the incident light being absorbed by the semiconductor. Isolation structures 252 prevent the scattered light from reaching an adjacent SPAD and causing cross-talk.

One or more microlenses 286 may be formed over SPAD 204-1. In the arrangement of FIG. 6, a first microlens 286-1 and a second microlens 286-2 are included. Microlens 286-1 has a toroidal shape (e.g., a ring shape with a central opening) and microlens 286-2 fills the opening of microlens 286-1. The microlenses may focus light towards light scattering structures 270 and SPAD 204-1. This example is merely illustrative, and other microlens arrangements (e.g., a single toroidal microlens, a single microlens having an upper surface with spherical curvature, two cylindrical microlenses, etc.) may be used if desired.

A planarization layer 282 may optionally be interposed between buffer layer 264 and microlens(es) 286. The planarization layer may increase the distance between the back surface of the substrate (256) and the upper surface of the microlens. Increasing this distance may improve the focusing ability of microlenses 286-1 and 286-2. An additional oxide layer 284 may be formed at the front side of substrate 254. An additional oxide layer 283 may also be formed on the back side of substrate 254 between buffer layer 264 and planarization layer 282. Oxide layers 283 and 284 may be formed from the same material or different materials. In general, each one of layers 283 and 284 may be formed from any material (e.g., silicon dioxide).

The light scattering structures each have a height 272 (sometimes referred to as depth) and a width 274. The light scattering structures also have a pitch 276 (e.g., the center-to-center separation between each light scattering structure). In general, each scattering structure may have a height 272 of less than 5 micron, less than 3 micron, less than 2 micron, less than 1 micron, less than 0.5 micron, less than 0.1 micron, greater than 0.01 micron, greater than 0.5 micron, greater than 1 micron, between 1 and 2 micron, between 0.5 and 3 micron, between 0.3 micron and 10 micron, etc. Each scattering structure may have a width 274 of less than 5 micron, less than 3 micron, less than 2 micron, less than 1 micron, less than 0.5 micron, less than 0.1 micron, greater than 0.01 micron, greater than 0.5 micron, greater than 1 micron, between 1 and 2 micron, between 0.5 and 3 micron, between 0.3 micron and 10 micron, etc. The pitch 276 may be less than 5 micron, less than 3 micron, less than 2 micron, less than 1 micron, less than 0.5 micron, less than 0.1 micron, greater than 0.01 micron, greater than 0.5 micron, greater than 1 micron, between 1 and 2 micron, between 0.5 and 3 micron, between 0.3 micron and 10 micron, etc. The ratio of the width 274 to the pitch 276 may be referred to as the duty cycle or the etch percentage for the substrate. The duty cycle (etch percentage) indicates how much unetched substrate is present between each pair of scattering structures and how much of the upper surface of the substrate is etched to form the light scattering structures. The ratio may be 100% (e.g., each scattering structure is immediately adjacent to surrounding scattering structures), lower than 100%, lower than 90%, lower than 70%, lower than 60%, greater than 50%, greater than 70%, between (and including) 50% and 100%, etc. The semiconductor substrate may have a thickness of greater than 4 micron, greater than 6 micron, greater than 8 micron, greater than 10 micron, greater than 12 micron, less than 12 micron, between 4 and 10 micron, between 5 and 20 micron, less than 10 micron, less than 6 micron, less than 4 micron, less than 2 micron, greater than 1 micron, etc.

In the example of FIG. 6, the scattering structures 270 have angled sidewalls (e.g., sidewalls that are non-orthogonal and non-parallel to back surface 256). The scattering structures may be pyramidal or may have a triangular cross-section that extends along a longitudinal axis (e.g., a triangular prism). The non-orthogonal angle may be greater than 10 degrees, greater than 30 degrees, greater than 60 degrees, less than 80 degrees, between 20 and 70 degrees, etc. The example of angled sidewalls in FIG. 6 is merely illustrative. The scattering structures may have vertical sidewalls (orthogonal to surface 256) if desired.

The arrangement and dimensions of scattering structures 270 may be selected to optimize the conversion of incident light. As shown in FIG. 6, the active area of SPAD 204-1 may not include the entirety of the substrate 254. The arrangement and dimensions of scattering structures 270 may be selected to direct incident light to SPAD 204-1 and not surrounding dead zones in the semiconductor substrate.

Microlenses 286-1 and 286-2 may have a thickness of greater than 0.5 micron, greater than 1 micron, greater than 2 microns, greater than 3 microns, greater than 5 microns, greater than 8 microns, between (and including) 1 and 10 microns, less than 10 microns, less than 5 microns, between (and including) 5 and 10 microns, between (and including) 3 and 5 microns, etc. These thickness ranges may apply to any of the microlenses described herein.

The light scattering structures may have a uniform density (number of light scattering structures per unit area). Alternatively, the light scattering structures may have a non-uniform density. Arranging light scattering structures with a non-uniform density in this manner may help direct light to SPAD 204-1 in an optimal manner. In general, etching substrate 254 (e.g., to form light scattering structures) may cause an increase in dark current in the SPAD-based semiconductor device. Accordingly, light scattering structures may be omitted where possible to minimize dark current while still optimizing absorption. Omitting light scattering structures may include reducing the density of the light scattering structures to a non-zero magnitude or entirely omitting the light scattering structures in a certain area of the microcell (e.g., to a density of zero).

In general, each microcell (and corresponding SPAD) may be covered by any desired microlens(es). However, there may be a correlation between the microlens design and the arrangement of the light scattering structures for the microcell. The microlenses may focus more light on a first area of the substrate than a second area of the substrate. The light scattering structures may therefore have a greater density (e.g., a higher percentage of the substrate is etched for the scattering structures) in the first area of the substrate than the second area of the substrate (to more effectively scatter the light). The second area of the substrate (with a lower density of scattering structures) may have no scattering structures (e.g., the scattering structures are entirely omitted) or may have a lower, non-zero density of scattering structures. The transition between different densities may be gradual or immediate.

In addition to the isolation structures 252 (which may sometimes be referred to as light absorbing structures 252 or light absorbing isolation structures 252), the SPAD-based semiconductor device may also include isolation structures 292 (sometimes referred to as reflective structures 292 or reflective isolation structures 292).

Trenches for structure 292 may be formed in substrate 254. The trenches may be etched from the front side of the substrate (e.g., from surface 258 towards surface 256). In other words, structures 292 may be front side deep trench isolation (FDTI) structures.

The trench of isolation structures 292 may be filled with a low-index filler 294. Low-index filler 294 (sometimes referred to as dielectric filler 294 or oxide filler 294) may have a lower refractive index than substrate 254 (e.g., a refractive index that is lower by more than 0.1, more than 0.2, more than 0.3, more than 0.5, more than 1.0, more than 1.5, more than 2.0, etc.). The low-index material in the trenches causes total internal reflection of light, keeping the light within the active area of SPAD 204-1 (instead of surrounding dead zones) and increasing the efficiency of SPAD 204-1. The low-index filler may be silicon dioxide or any other desired material. In some cases, the same material that forms oxide layer 284 may be used as the low-index filler 294.

In addition to low-index filler 294, isolation structures 292 may include a passivation layer 296. Passivation layer 296 may be a high dielectric constant coating that is formed between the substrate 254 and low-index filler 294. The passivation layer 296 (sometimes referred to as high k coating 296) may mitigate dark current. As one example, the passivation coating may be an oxide coating (e.g., aluminum oxide, hafnium oxide, tantalum oxide, etc.). Passivation layer 296 may be formed from the same material as passivation layer 262 or from a different material as passivation layer 262.

SPAD-based semiconductor device 14 may therefore may include two separate ring-shaped isolation structures. Isolation structures 252 may include a light absorbing material and may prevent cross-talk between adjacent microcells. Isolation structures 292 may include a low-index material and may help keep light within the active region of SPAD 204-1. Isolation structures 252 may be referred to as outer isolation structures and isolation structures 292 may be referred to as inner isolation structures. Both isolation 252 and 292 may be considered as a singular structure (e.g., a single ring-shaped structure) or plural structures (that combine to form a ring shape) as a matter of nomenclature.

As shown in FIG. 6, the trench for isolation structures 292 extends only partially through semiconductor substrate 254. The depth of isolation structures 292 may be less than 90% of the substrate thickness, less than 80% of the substrate thickness, less than 60% of the substrate thickness, less than 50% of the substrate thickness, less than 40% of the substrate thickness, more than 50% of the substrate thickness, between 20% and 90% of the substrate thickness, etc. Alternatively, isolation structure 292 may extend entirely through the substrate (similar to the outer structure 252 of FIG. 6).

SPAD 204-1 may have an anode contact and a cathode contact (that are coupled to the semiconductor substrate). In one example, the anode contact may be formed from the metal filler 260 in isolation structure 252. FIG. 6 shows how a bias voltage VBIAS may optionally be supplied to the metal filler 260. One or more vias may be used to couple metal filler 260 to the bias voltage. Additionally, there may be one or more portions where metal filler 260 directly contacts semiconductor substrate 254 to serve as the anode contact. For example, portions of passivation layer 262 and/or buffer layer 264 may be removed (e.g., in the bottom of the trench) such that filler 260 directly contacts semiconductor substrate 254.

Inner isolation structure 292 (whether FDTI as in FIG. 6 or BDTI as in FIG. 7) may optionally have a doped semiconductor liner 298. The doped liner may be formed by p-type doped portion of semiconductor substrate 254, as one example. During manufacturing, after the trench for deep trench isolation (DTI) 292 is formed, p-type dopants may be implanted to form a p-type liner around the sidewalls of the trench. The doped semiconductor liner may mitigate dark current. Additionally, the anode contact may be formed from the doped semiconductor liner 298. FIG. 6 shows how a bias voltage VBIAS may optionally be supplied to the doped semiconductor liner 298. One or more vias may be used to couple doped semiconductor liner 298 to the bias voltage. Doped semiconductor liner 298 directly contacts semiconductor substrate 254 to serve as the anode contact.

In FIG. 6, inner isolation structure 292 is formed as front side deep trench isolation (and outer isolation structure is either BDTI or FDTI). This example is merely illustrative. In another example, shown in FIG. 7, inner isolation structure 292 may be a backside deep trench isolation structure. The trench for BDTI 292 extends from back surface 256 towards front surface 258. As in FIG. 6, BDTI 292 in FIG. 7 includes passivation layer 296 and a low-index filler 294.

Figure 7:
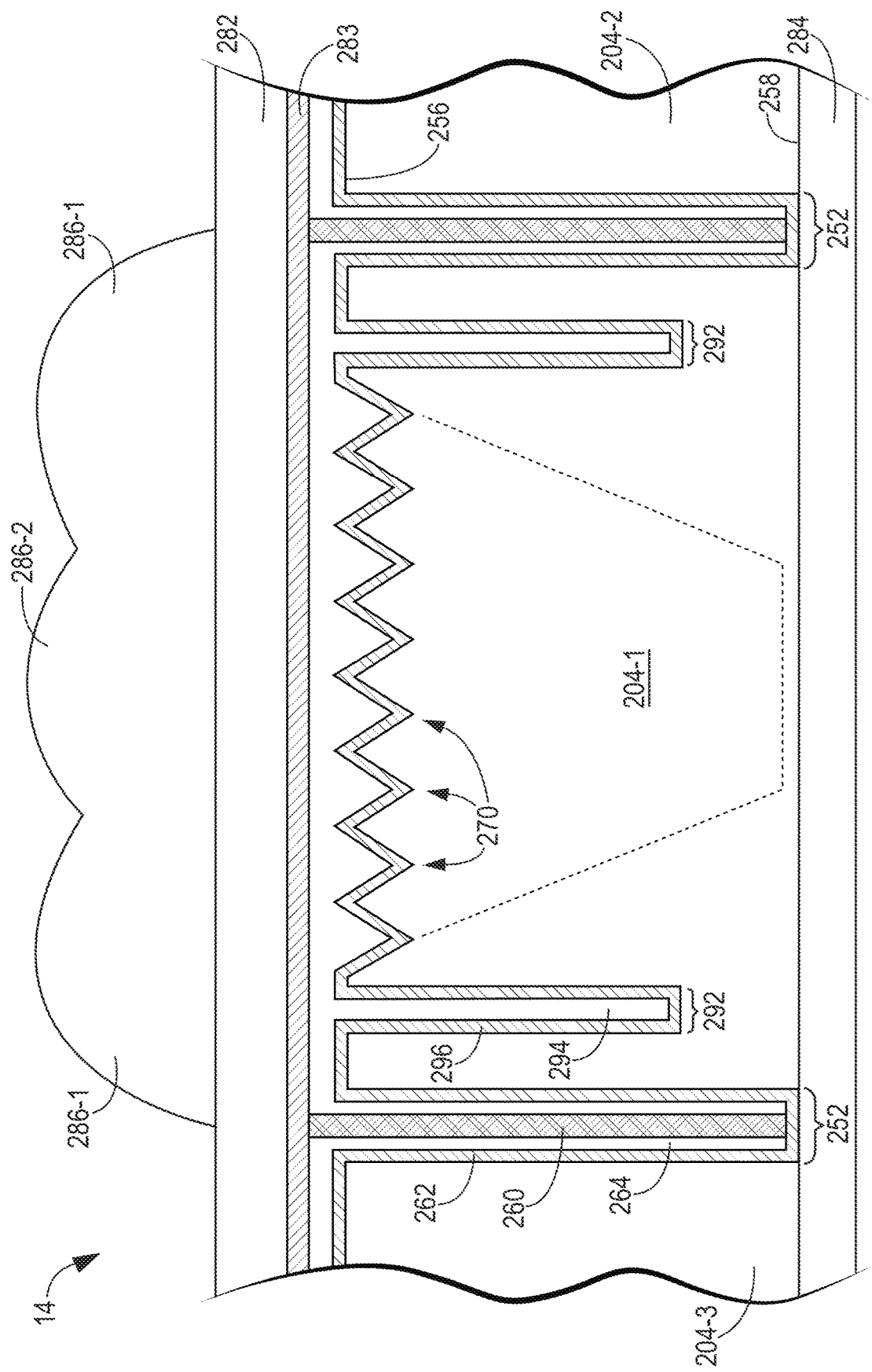
FIG. 7 is a cross-sectional side view of an illustrative SPAD-based semiconductor device having an outer isolation structure that absorbs light and an inner backside deep trench isolation (BDTI) structure that reflects light in accordance with an embodiment.

As shown in FIG. 7, passivation layer 296 may be formed from the same material as (e.g., formed integrally with) passivation layer 262. Low-index filler 294 may be formed from the same material as (e.g., formed integrally with) buffer layer 264. In FIG. 7, isolation structures 252 may be FDTI or BDTI.

As shown in FIG. 7, the trench for isolation structures 292 extends only partially through semiconductor substrate 254. The depth of isolation structures 292 may be less than 90% of the substrate thickness, less than 80% of the substrate thickness, less than 60% of the substrate thickness, less than 50% of the substrate thickness, less than 40% of the substrate thickness, more than 50% of the substrate thickness, between 20% and 90% of the substrate thickness, etc. Alternatively, isolation structure 292 may extend entirely through the substrate (similar to the outer structure 252 of FIG. 7).

Figure 8:
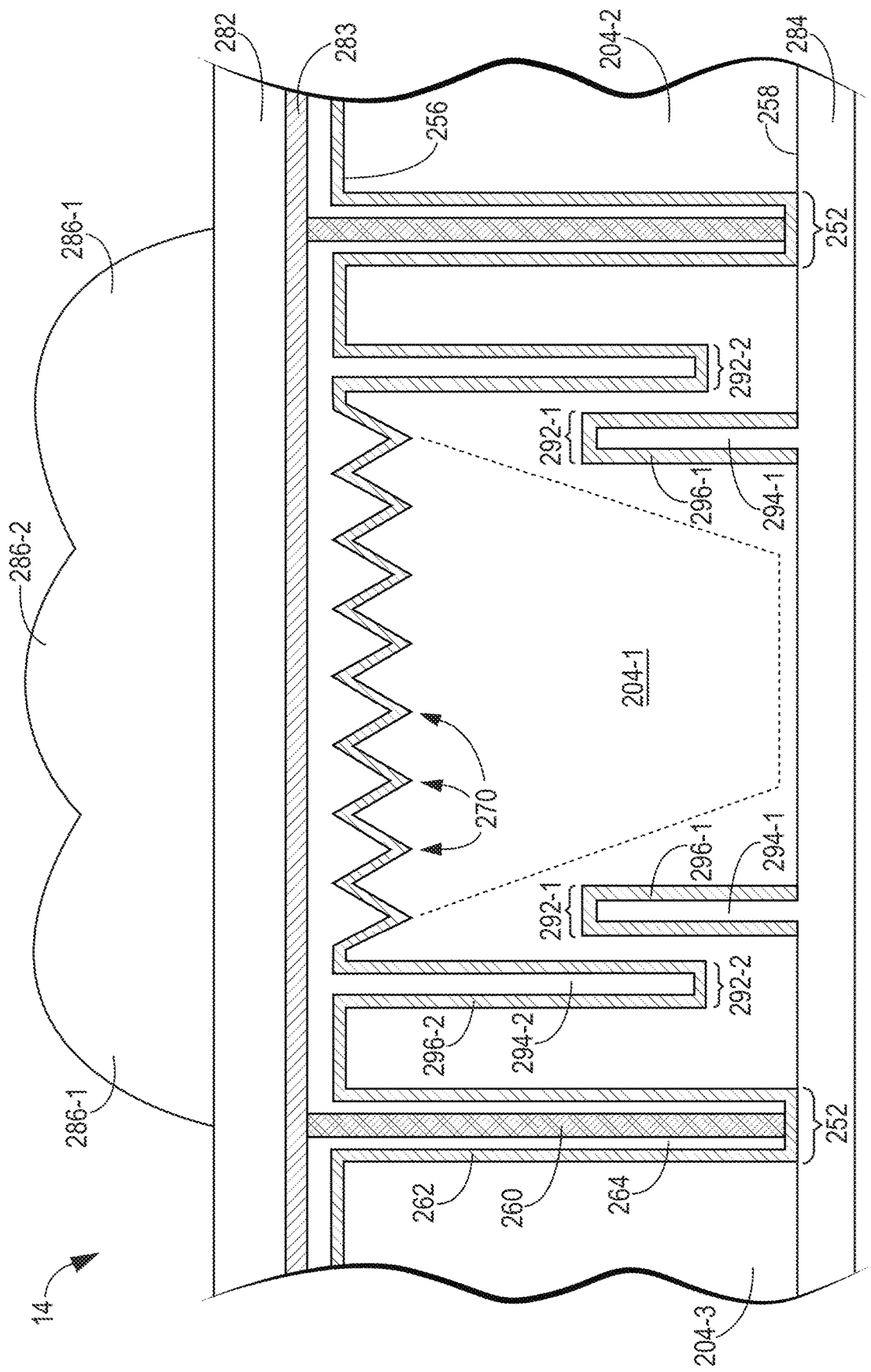
FIG. 8 is a cross-sectional side view of an illustrative SPAD-based semiconductor device having an outer isolation structure that absorbs light and two inner isolation structures that reflect light in accordance with an embodiment.

In some cases, multiple ring-shaped inner isolation structures may be included in a single microcell. FIG. 8 shows an example of a SPAD-based semiconductor device with a first inner isolation structure 292-1 and a second inner isolation structure 292-2. Both structures 292-1 and 292-2 may be ring-shaped and laterally surround SPAD 204-1. Each isolation structure has a respective passivation layer and low-index filler, similar to as already described in connection with FIGS. 6 and 7. The materials for isolation structures 292-1 and 292-2 may be the same or may be different. Each inner isolation structure may be used to reflect incident light (using total internal reflection) to convert light in SPAD 204-1.

In FIG. 8, isolation structure 292-1 is a front side deep trench isolation structure whereas isolation structure 292-2 is a backside deep trench isolation structure. This example is merely illustrative. In another possible embodiment, the isolation structure closer to SPAD 204-1 may be BDTI and the other inner isolation structure may be FDTI.

Figure 9:
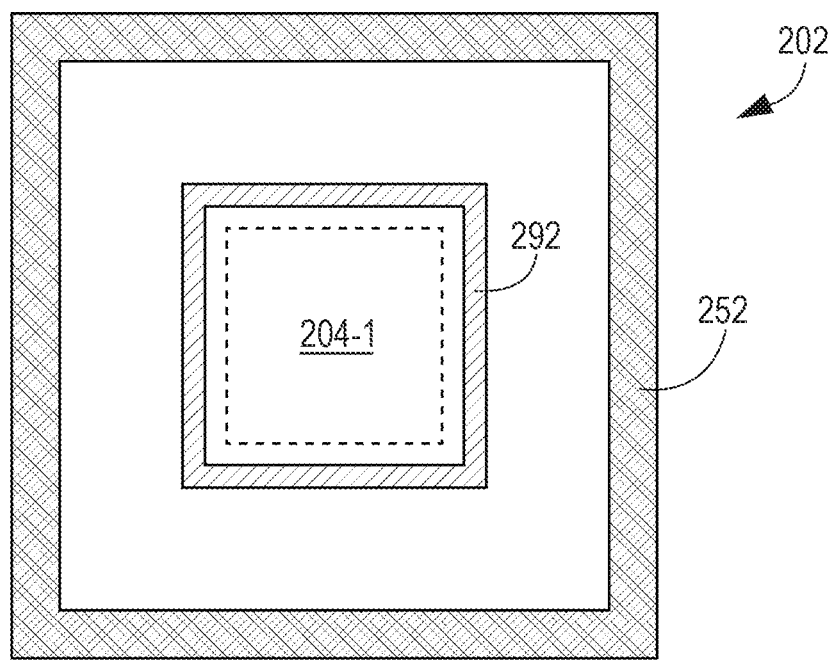
FIG. 9 is a top view of an illustrative microcell having an outer isolation structure that absorbs light and an inner isolation structure that reflects light in accordance with an embodiment.

FIG. 9 is a top view of an illustrative microcell having two rings of isolation structures (as in FIG. 6 or FIG. 7, for example). As shown, outer isolation structure 252 laterally surrounds SPAD 204-1 and has a central opening. SPAD 204-1 and inner isolation structure 292 are formed in the central opening. Inner isolation structure 292 laterally surrounds SPAD 204-1. Outer isolation structure 252 may include a light absorbing material such as a metal filler (e.g., tungsten). Inner isolation structure may include a low-index material that causes total internal reflection (e.g., silicon dioxide).

Outer isolation structure 252 may be BDTI or FDTI. Inner isolation structure 292 may be BDTI or FDTI. As one example, structure 252 may be FDTI and structure 292 may be BDTI. Any combination of BDTI and FDTI may be used.

Figure 10:
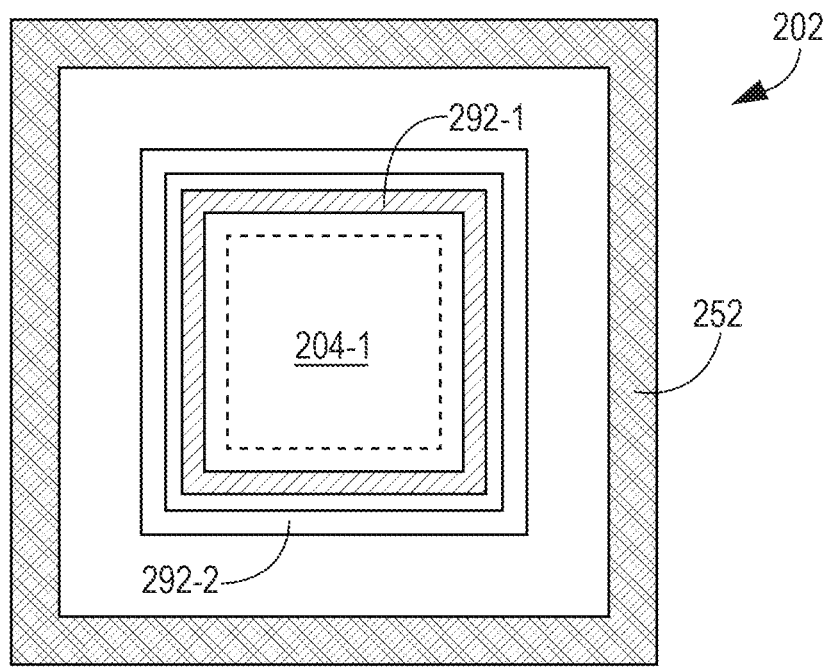
FIG. 10 is a top view of an illustrative microcell having an outer isolation structure that absorbs light and two inner isolation structures that reflect light in accordance with an embodiment.

FIG. 10 is a top view of an illustrative microcell having three rings of isolation structures (as in FIG. 8, for example). As shown, outer isolation structure 252 laterally surrounds SPAD 204-1 and has a central opening. SPAD 204-1, inner isolation structure 292-1, and inner isolation structure 292-2 are formed in the central opening. Inner isolation structure 292-2 laterally surrounds SPAD 204-1 and inner isolation structure 292-1. Inner isolation structure 292-1 laterally surrounds SPAD 204-1.

Outer isolation structure 252 may include a light absorbing material such as a metal filler (e.g., tungsten). Inner isolation structures 292-1 and 292-2 may include a low-index material that causes total internal reflection (e.g., silicon dioxide).

Outer isolation structure 252 may be BDTI or FDTI. Inner isolation structure 292-1 may be BDTI or FDTI. Inner isolation structure 292-2 may be BDTI or FDTI. Any combination of BDTI and FDTI may be used.

The examples in FIGS. 9 and 10 of two and three rings of isolation structures respectively are merely illustrative. Additional rings of isolation structures (that are either BDTI or FDTI) may be included if desired.

Figure 11:
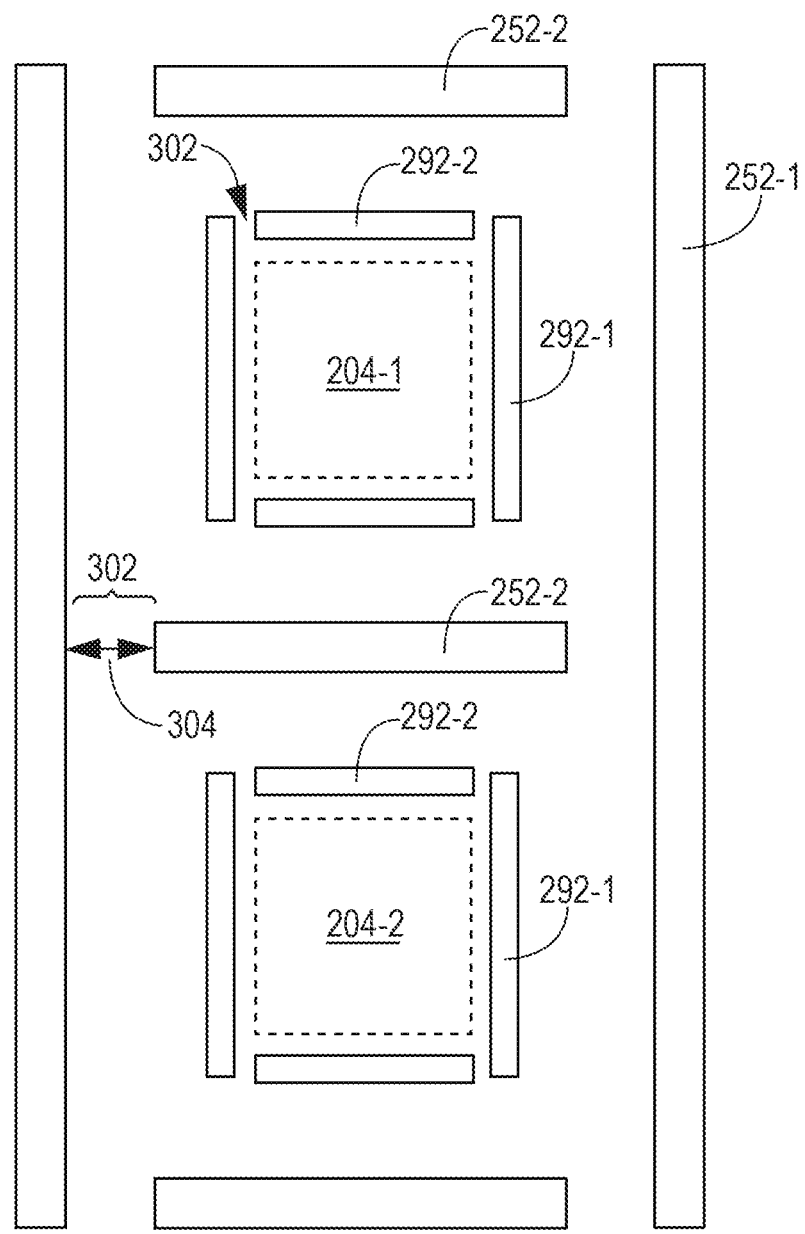
FIG. 11 is a top view of illustrative microcells showing how inner and outer isolation structures may be formed as broken rings in accordance with an embodiment.

It should be noted that the rings of isolation structures may be broken rings in order to mitigate manufacturing complexity. It may be challenging to manufacture isolation structures having vertical segments that intersect with horizontal segments. FIG. 11 is a top view of illustrative microcells showing how the isolation structures may be formed as broken rings. As shown, isolation structures 252 include vertical segments 252-1 and horizontal segments 252-2. There may be gaps 302 between the horizontal and vertical segments.

Including small gaps 302 may mitigate manufacturing complexity while still providing satisfactory isolation between microcells. The gaps may have widths 304 that are less than 2 microns, less than 1 micron, less than 0.5 microns, less than 0.1 micron, less than 0.01 micron, greater than 0.01 micron, etc. Width 304 may be less than 10% of the width of the microcell, less than 5% of the width of the microcell, less than 2% of the width of the microcell, etc.

In FIG. 11, vertical isolation structure segments 252-1 extend continuously between microcells (without an intervening gap). This example is merely illustrative. If desired, there may be a gap between the vertical isolation structure segments of adjacent microcells. In yet another possible arrangement, the horizontal isolation structure segments may extend continuously between microcells. The inner isolation structures also may have gaps between vertical and horizontal segments. FIG. 11 shows how isolation structures 292 include vertical segments 292-1 and horizontal segments 292-2. Again, there may be gaps 302 between the horizontal and vertical segments. Including gaps 302 may mitigate manufacturing complexity while still providing satisfactory isolation.

Because the gaps 302 are very small, the isolation structures of FIG. 11 may still be considered rings of isolation structures. These rings may be referred to as broken rings, interrupted rings, or dashed rings. However, the broken rings may still be considered to laterally surround a central opening.

The foregoing is merely illustrative of the principles of this invention and various modifications can be made by those skilled in the art. The foregoing embodiments may be implemented individually or in any combination.

What is claimed is:

1. A semiconductor device comprising:
   a substrate having a thickness;
   a single-photon avalanche diode in the substrate;
   a first deep trench isolation structure in the substrate that forms a first ring around the single-photon avalanche diode; and
   a second deep trench isolation structure in the substrate that forms a second ring around the single-photon avalanche diode, wherein the second deep trench isolation structure has a depth that is less than the thickness.

2. The semiconductor device defined in claim 1, wherein the first deep trench isolation structure comprises a trench and a metal filler in the trench.

3. The semiconductor device defined in claim 2, wherein the metal filler comprises tungsten.

4. A semiconductor device comprising:
   a substrate having a thickness;
   a single-photon avalanche diode in the substrate;
   a first deep trench isolation structure in the substrate that forms a first ring around the single-photon avalanche diode; and
   a second deep trench isolation structure in the substrate that forms a second ring around the single-photon avalanche diode, wherein the second deep trench isolation structure has a depth that is less than the thickness, wherein the first deep trench isolation structure comprises a trench and a metal filler in the trench, and wherein the metal filler is coupled to a bias voltage and serves as an anode contact for the single-photon avalanche diode.

5. The semiconductor device defined in claim 1, wherein the first deep trench isolation structure comprises a trench and a light absorbing filler in the trench.

6. The semiconductor device defined in claim 5, wherein the second deep trench isolation structure comprises an additional trench and a low-index filler in the additional trench.

7. The semiconductor device defined in claim 1, wherein the second deep trench isolation structure is interposed between the first deep trench isolation structure and the single-photon avalanche diode.

8. The semiconductor device defined in claim 7, wherein the first deep trench isolation structure is configured to absorb light and wherein the second deep trench isolation structure is configured to reflect light.

9. The semiconductor device defined in claim 7, wherein the first deep trench isolation structure is a front side deep trench isolation structure and wherein the second deep trench isolation structure is a backside deep trench isolation structure.

10. The semiconductor device defined in claim 1, further comprising:
    a plurality of light scattering structures in the substrate over the single-photon avalanche diode.

11. The semiconductor device defined in claim 1, wherein the second deep trench isolation structure comprises a trench in the substrate and a p-type doped liner adjacent to the trench.

12. The semiconductor device defined in claim 11, wherein the p-type doped liner is coupled to a bias voltage and serves as an anode contact for the single-photon avalanche diode.

13. A semiconductor device comprising:
    a substrate;
    a single-photon avalanche diode in the substrate;
    an outer ring-shaped deep trench isolation structure having a central opening, wherein the single-photon avalanche diode is in the central opening; and
    an inner ring-shaped deep trench isolation structure that surrounds the single-photon avalanche diode and that is in the central opening, wherein the inner ring-shaped deep trench isolation structure is interposed between the single-photon avalanche diode and the outer ring-shaped deep trench isolation structure and wherein the inner ring-shaped deep trench isolation structure is more reflective than the outer ring-shaped deep trench isolation structure.

14. The semiconductor device defined in claim 1, wherein the first deep trench isolation structure forms the first ring around the single-photon avalanche diode within a given plane, wherein the second deep trench isolation structure forms the second ring around the single-photon avalanche diode within the given plane, wherein the second deep trench isolation structure is interposed between the first deep trench isolation structure and the single-photon avalanche diode within the given plane, wherein the first deep trench isolation structure extends completely through the thickness of the substrate, wherein the first deep trench isolation structure comprises a first trench and a first filler in the first trench, wherein the second deep trench isolation structure comprises a second trench and a second filler in the second trench, and wherein the second filler is more reflective than the first filler.

15. The semiconductor device defined in claim 13, wherein the substrate has a thickness, wherein the outer ring-shaped deep trench isolation structure extends completely through the thickness of the substrate, and wherein the inner ring-shaped deep trench isolation structure has a depth that is less than the thickness.

16. The semiconductor device defined in claim 4, wherein the first deep trench isolation structure extends completely through the thickness of the substrate.

17. The semiconductor device defined in claim 4, wherein the second deep trench isolation structure extends only partially through the thickness of the substrate.

18. The semiconductor device defined in claim 13, wherein the outer ring-shaped deep trench isolation structure comprises a trench and a metal filler in the trench and wherein the metal filler is coupled to a bias voltage and serves as an anode contact for the single-photon avalanche diode.

19. The semiconductor device defined in claim 13, wherein the inner ring-shaped deep trench isolation structure comprises a trench in the substrate and a p-type doped liner adjacent to the trench and wherein the p-type doped liner is coupled to a bias voltage and serves as an anode contact for the single-photon avalanche diode.

20. The semiconductor device defined in claim 15, wherein the substrate has first and second opposing sides and wherein the semiconductor device further comprises:
 a plurality of light scattering structures in the first side of the substrate over the single-photon avalanche diode, wherein the inner ring-shaped deep trench isolation structure extends from the second side of the substrate towards the first side of the substrate.

* * * * *